United States Patent
Kim et al.

(10) Patent No.: US 6,891,436 B2
(45) Date of Patent: May 10, 2005

(54) TRANSCONDUCTANCE VARYING CIRCUIT OF TRANSCONDUCTOR CIRCUIT, VARYING BANDWIDTH FILTER CIRCUIT USING THE SAME AND DIGITAL TUNING CIRCUIT OF TRANSCONDUCTOR-CAPACITOR FILTER

(75) Inventors: Seyeob Kim, Seoul (KR); Bo-Eun Kim, Youngin-si (KR); Minsu Jeong, Anyang-si (KR)

(73) Assignee: Integrant Technologies Inc., Seongnam-Si (KR)

( * ) Notice: Subject to any disclaimer, the term of this patent is extended or adjusted under 35 U.S.C. 154(b) by 0 days.

(21) Appl. No.: 10/673,555

(22) Filed: Sep. 30, 2003

(65) Prior Publication Data

US 2004/0104746 A1 Jun. 3, 2004

(30) Foreign Application Priority Data

Sep. 30, 2002 (KR) ................................ 10-2002-0059258
Sep. 30, 2002 (KR) ................................ 10-2002-0059260

(51) Int. Cl.[7] ................................................ H03F 3/45
(52) U.S. Cl. .................................... 330/254; 330/253
(58) Field of Search .............................. 330/305, 253, 330/254, 261; 327/359

(56) References Cited

U.S. PATENT DOCUMENTS

| | | | |
|---|---|---|---|
| 5,245,646 A | | 9/1993 | Jackson et al. |
| 5,914,633 A | | 6/1999 | Comino et al. |
| 6,111,463 A | * | 8/2000 | Kimura ........................ 330/254 |
| 6,515,518 B1 | * | 2/2003 | Minegishi ..................... 327/65 |
| 6,529,075 B2 | * | 3/2003 | Bruck et al. ................. 330/252 |
| 6,714,075 B2 | * | 3/2004 | Morie et al. ................. 330/254 |

* cited by examiner

Primary Examiner—Henry Choe
(74) Attorney, Agent, or Firm—Shinjyu Global IP Counselors, LLP (57) ABSTRACT

The present invention relates to a circuit for varying bandwidth of transconductance-capacitor filter by controlling transconductance of a transconductance circuit, and a digital tuning circuit of transconductor-capacitor filter. A transconductor of an embodiment of the present invention comprises a first and second amplifying devices; a resistor; a first and second bias current sources; and transconductance varying circuit. A tuning circuit of another embodiment of the invention relates to a digital tuning circuit comprising a transconductor that outputs current proportional to input voltage and a varying capacitance that is connected with output node of transconductor and between grounds and varies its capacitance depending upon the level of control signal. The digital tuning circuit further comprises a transconductor, a comparator, a counter, a varying capacitor, means for maintaining the output voltage of the transconductor as substantial zero for first period, and means for inputting input voltage to the transconductor for second period and means for inputting the output voltage of the transconductor to input node of the comparator.

3 Claims, 6 Drawing Sheets

TRANSCONDUCTANCE VARYING CIRCUIT OF TRANSCONDUCTOR CIRCUIT, VARYING BANDWIDTH FILTER CIRCUIT USING THE SAME AND DIGITAL TUNING CIRCUIT OF TRANSCONDUCTOR-CAPACITOR FILTER

TECHNICAL FIELD

The present invention relates to a communication system. In particular, it is directed to a varying bandwidth gm-C filter using varying circuit of transconductance of transconductor and gm-C filter using digital tuning circuit.

BACKGROUND OF THE INVENTION

The gm-C filter which is a filter comprising a transconductor and a capacitor is a widely used device for reconstructing received signal in a communication apparatus and for anti-aliasing of transmitted signal. The transconductor means a circuit for outputting current proportional to applied input voltage thereto. The output current is calculated with multiplying the applied voltage by transconductance gm.

In a transconductor-capacitor filter, transconductance gm is an importance parameter for determining output current of transconductor and cut-off frequency of a filter. The transconductance gm is determined in accordance with the transconductor.

Figure 1:
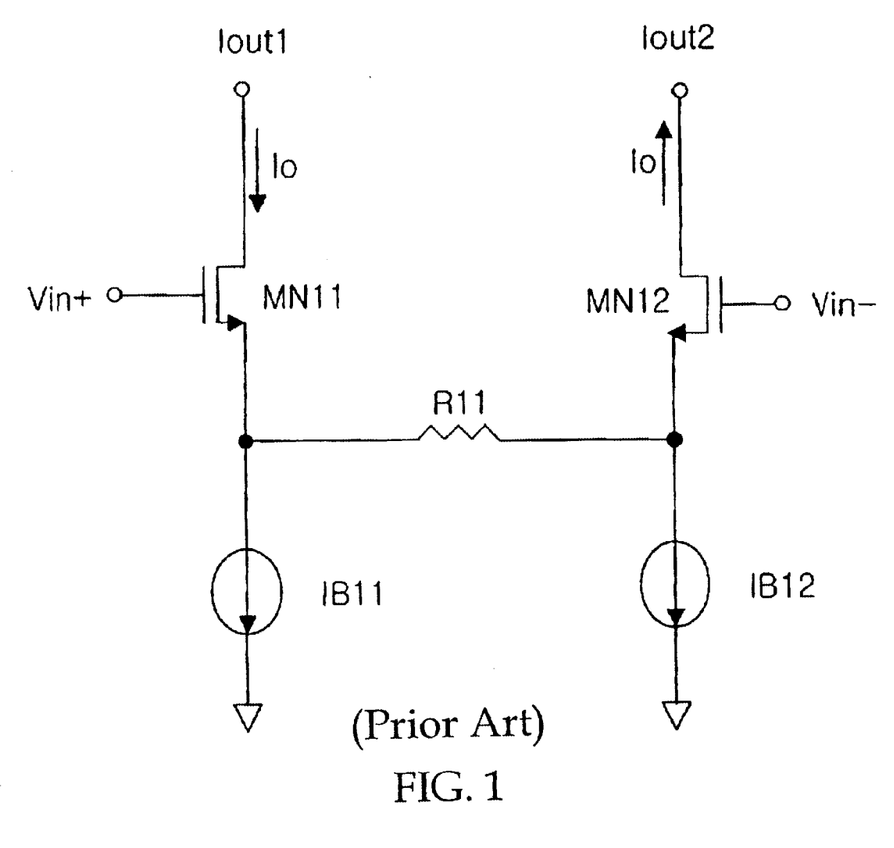
FIG. 1 shows a circuit diagram of a transconductor of the conventional transconductor-capacity filter.

FIG. 1 shows a circuit diagram of a conventional transconductor.

As shown in FIG. 1, the transconductor comprises first and second NMOS transistors MN 11 and MN 12, first and second bias current sources IB11 and IB12 and a degeneration resistor R11.

The relation between the components will be described with reference to FIG. 1.

The gates of the first and second NMOS transistors MN11 and MN12 form first and second input nodes Vin+ and Vin−, respectively. The drains of the transistors form first and second output nodes Iout1 and Iout2, respectively. Bias current is supplied to the sources of the first and second NMOS transistors MN11 and MN12 from the first and second bias current sources IB11 and IB12. The degeneration resistor R11 is provided between the sources of the first and second NMOS transistors MN11 and MN12.

The first and second input voltage Vin+ and Vin− applied to the gates of the first and second NMOS transistors MN11 and MN12 causes current lo in the first and second output nodes Iout1 and Iout2, which has value calculated with multiplying input voltage Vin by transconductance gm. The transconductance gm is determined by the degeneration resistor R11 and is in inverse proportional to resistance value of R11.

The cut-off frequency of a transconductor-capacitor filter is linearly proportional to gm/C. Thus, transconductance gm of the transconductor maintains an initial value if a passive device R11 having fixed resistance is used as shown in FIG. 1. Further, the bandwidth of the filter has constant value. Much recent communication system receives more than two signals having different bandwidth one another. If the above-described filter wherein bandwidth is fixed is used for the system, a plurality of filters having different cut-off frequency one another should be used. Thus, a varying bandwidth filter has been studied in order to resolve the problem.

Much recent communication system receives more than two signals having different bandwidth one another. If the above-described filter wherein bandwidth is fixed is used for the system, a plurality of filters having different cut-off frequency one another should be used. Thus, a varying bandwidth filter has been studied in order to resolve the problem.

There is a conventional apparatus which uses MOSFET device for varying cut-off frequency of the filter depending upon received signal, in lieu of degeneration resistor R11. In this apparatus, resistance of the MOSFET device varies by applying different control voltage to the gates of the MOSFET device in accordance with received signal. The resistance of the degeneration resistor can vary in accordance with the received signal, thereby varying transconductance gm of the transconductor.

However, in the conventional art, the range of reluctance that can be obtained from control of voltage applied to the gate of MOSFET device is very limited, thereby limiting the variation of cut-off frequency of the filter. Further, the non-linearity of MOSFET device causes performance deterioration of the filter.

In a transconductance-capacitor filter, the transconductance gm varies up to 50% from design value in accordance with temperature, variation of power voltage and manufacturing process and the like. Thus, the transconductance-capacitor filter should employ tuning circuit that maintains cut-off frequency as being constant.

The conventional tuning circuit is usually an analog tuning circuit that controls transconductance gm of transconductor so as to maintain the cut-off frequency of the filter as being constant.

However, there is problem in that the clock used in the analog tuning circuit causes noise and the circuit operates continuously even when tuing is unnecessary. These are reasons for wasting power and deteriorating filter performance.

U.S. Pat. Nos. 5,245,646 and 5,914,633 disclose a digital tuning circuit for resolving the problems of the analog tuning circuit.

The tuning circuit disclosed by the patents is a tuning circuit of RC active filter which maintains cut-off frequency as being constant with digital control of RC time constant. That is, capacitor of the RC active filter is embodied as capacitor array and digital codes controls on-off of the capacitors of the array so as to compensate the variation of time constant caused by operating condition, temperature and the like.

However, the conventional digital tuning circuit is limited to RC active filter. It is difficult that the circuit is used for tuning circuit of transconductor-capacitor filter which should detect/compensate the variation of transconductance gm.

SUMMARY OF THE INVENTION

It is therefore an object of the present invention to provide a transconductor circuit for varying transconductance gm linearly.

It is another object of the present invention to provide a transconductor-capacitor filter for varying bandwidth with varying transconductance of transconductor.

It is further object of the present invention to provide a digital tuning circuit for maintaining cut-off frequency of a transconductor-capacitor filter.

It is yet another object of the present invention to provide a tuning circuit which does not operate when tuning is not necessary.

In order to achieve the object, the transconductance varying circuit of a transconductor circuit in accordance with the present invention comprises (1) a first and second amplifying device having first, second and third nodes, wherein amount of current flowing to said second node from said first node is controlled in proportion to voltage applied to said third node; (2) a resistor being connected between said second nodes of said first and second amplifying devices; (3) a first and second bias current source being connected with said second nodes and grounds of said first and second amplifying devices; and (4) at least one resistor and at least one switching means wherein said resistor and switching means are serially connected with each other to be connected with said second nodes of said first and second amplifying device.

The transconductor-capacitor filter having a transconductor and capacitor of the present invention has transconductor which comprises (1) a first and second amplifying devices having a first, second and third nodes wherein amount of current flowing to said second node from said first node is controlled in proportion to voltage applied to said third node; (2) a resistor being connected between said second nodes of said first and second amplifying devices; (3) a first and second bias current source being connected with said second nodes and grounds of said first and second amplifying devices; and (4) at least one resistor and at least one switching means wherein said resistor and switching means are serially connected with each other to be connected with said second nodes of said first and second amplifying device.

The first and second amplifying devices are MOSFET and the first, second and third nodes are drain, source, and gate, respectively.

BRIEF DESCRIPTION OF THE DRAWINGS

The preferred embodiments of the present invention will be described in detail with reference to attached drawings.

DETAILED DESCRIPTION

Hereinafter, preferred embodiments of the present invention will be described in detail with reference to the attached drawings.

The First Embodiment

Figure 2:
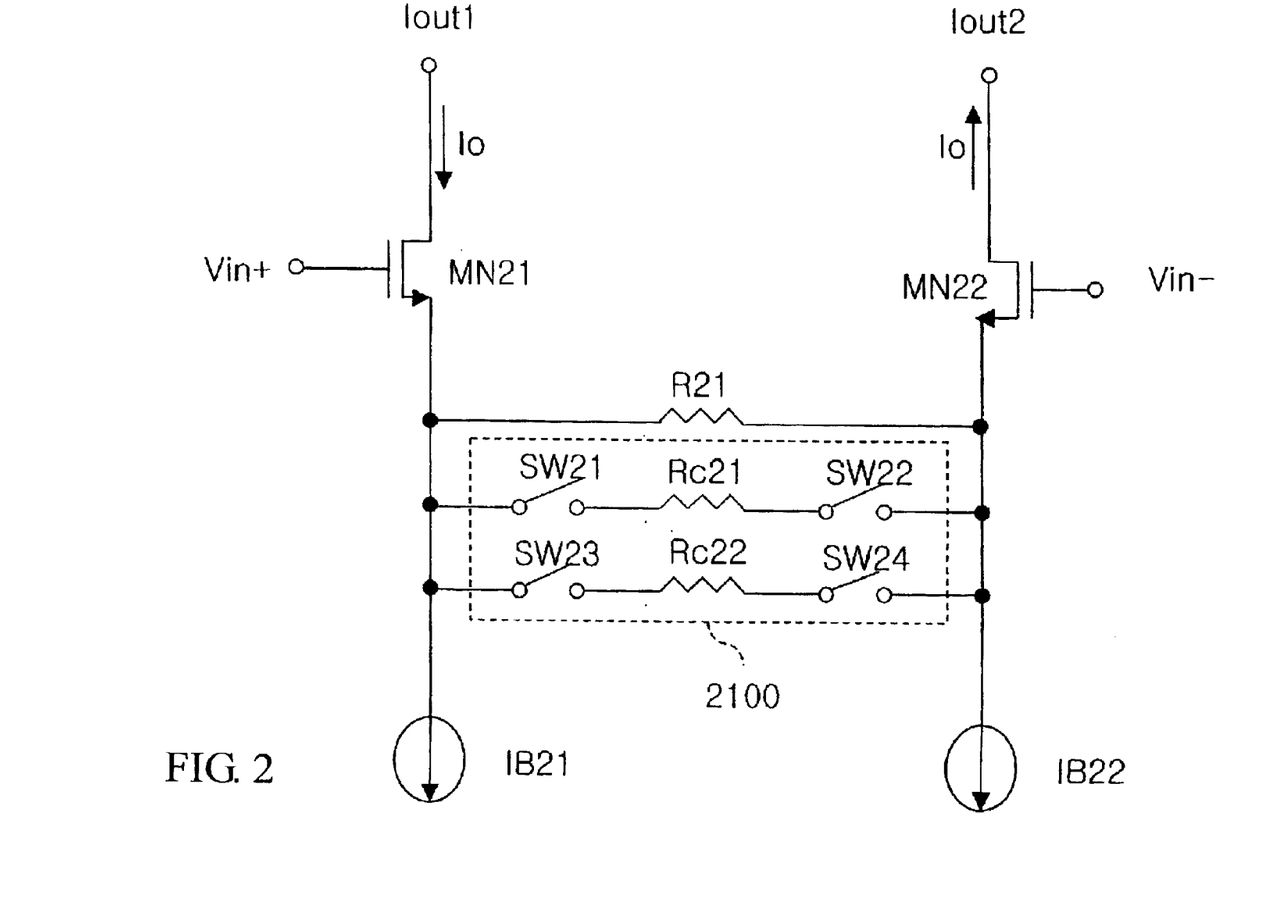
FIG. 2 shows a circuit diagram of a transconductor according to an embodiment of the present invention.

FIG. 2 shows a circuit diagram showing a transconductor of an embodiment of the present invention.

The transconductor of this embodiment uses MOSFET amplifying device. The amplifying device comprises a gate, a source and a drain. MOSFET amplifying device has a characteristic wherein the amount of current and the direction of current which flows to the source from the drain or vice versa are determined in accordance with voltage and polarity of the voltage applied to the gate. Such an amplifying device includes a bipolar junction transistor (BJT), a junction field effect transistor (JFET), a metal-oxide semiconductor field effect transistor (MOSFET), a metal semiconductor field effect semiconductor and the like.

Of the above-listed devices, MOSFET will be described mainly in the below. However, the spirit of the present invention is not limited to MOSFET and extends to all of the devices operating complementarily. Further, the following description relates to N-MOSFET. However, it is also clear in the related field that the present invention can be applied to P-MOSFET.

As shown in FIG. 2, the transconductor of an embodiment of the present invention comprises first and second amplifying devices MN21 and MN22, first and second bias current sources IB21 and IB22, resistor R21 and transconductance varying circuit 2100. Transconductance varying circuit 2100 comprises one or more resistor. The circuit controls degeneration resistance of the transconductor, thereby varying transconductance gm.

The connection among the components will be described with reference to FIG. 2.

The gates of first and second amplifying devices MN21 and MN22 form first and second input nodes Vin+ and Vin−, respectively. The drains of the devices form first and second output nodes Iout1 and Iout2, respectively. First and second bias current sources IB21 and IB22 supply bias current to the sources of first and second amplifying devices MN21 and MN22, respectively. Resistor R21 is provided between the sources of first and second NMOS transistors MN21 and MN22.

Transconductance varying circuit 2100 is provided between the sources of first and second amplifying devices MN21 and MN22. One end of first resistor Rc21 is connected with the source of first amplifying device MN21 through first switching means SW21 while the other end of the resistor is connected with the source of second amplifying device MN22 through second switching means SW22. One end of second resistor Rc22 is connected with the source of first amplifying device MN21 through third switching means SW23 while the other end of the resistor is connected with the source of second amplifying device MN22 through fourth switching means SW24.

In transconductance varying circuit 2100 of the embodiment, substantially same switching means are connected to both ends of first and second resistors Rc21 and Rc22. However, this is for matching characteristic of transistors. It should be understood that the spirit of the present invention is not limited to the number of switching means connected to first and second resistors Rc21 and Rc22. That is, it is possible that only one switch is connected to one end of first and second resistors Rc21 and Rc22 while the other ends of first and second resistors Rc21 and Rc22 are directly connected to the source of the amplifying device.

FIG. 2 shows first and second resistors Rc21 and Rc22 and first to fourth switching means SW21 to SW24 for convenience of description. However, more resistors and switching means may be connected between the sources of first and second amplifying devices. In an embodiment, transconductance varying circuit 2100 can be formed only using first resistor Rc21 and first and second switching means SW21 and SW22.

The operation of the transconductor of the embodiment will be described in detail.

First and second amplifying devices MN21 and MN22 controls current lo flowing in drain with input voltage Vin+ and Vin− applied to each gate.

Transconductance varying circuit 2100 controls on-off of first to fourth switching means SW21 to SW24, thereby varying degeneration resistance of the transconductor. Further, first and second switching means SW21 and SW22 and third and fourth switching means SW23 and SW24, operate as a pair, respectively.

As described in the above, transconductance gm of the transconductor is in inverse proportion to the degeneration resistance value. Thus, the transconductance gm can vary by controlling the resistance of transconductance varying circuit 2100. If all of the switches are open, minimum transconductance gm is obtained since only resistor R21 is the degeneration resistor. On the other hand, if all of the switches are closed, maximum transconductance gm is obtained.

Further, since cut-off frequency of a transconductor-capacitor filter is proportional to transconductance gm of transconductor, the cut-off frequency can be controlled by varying transconductance gm.

Figure 3:
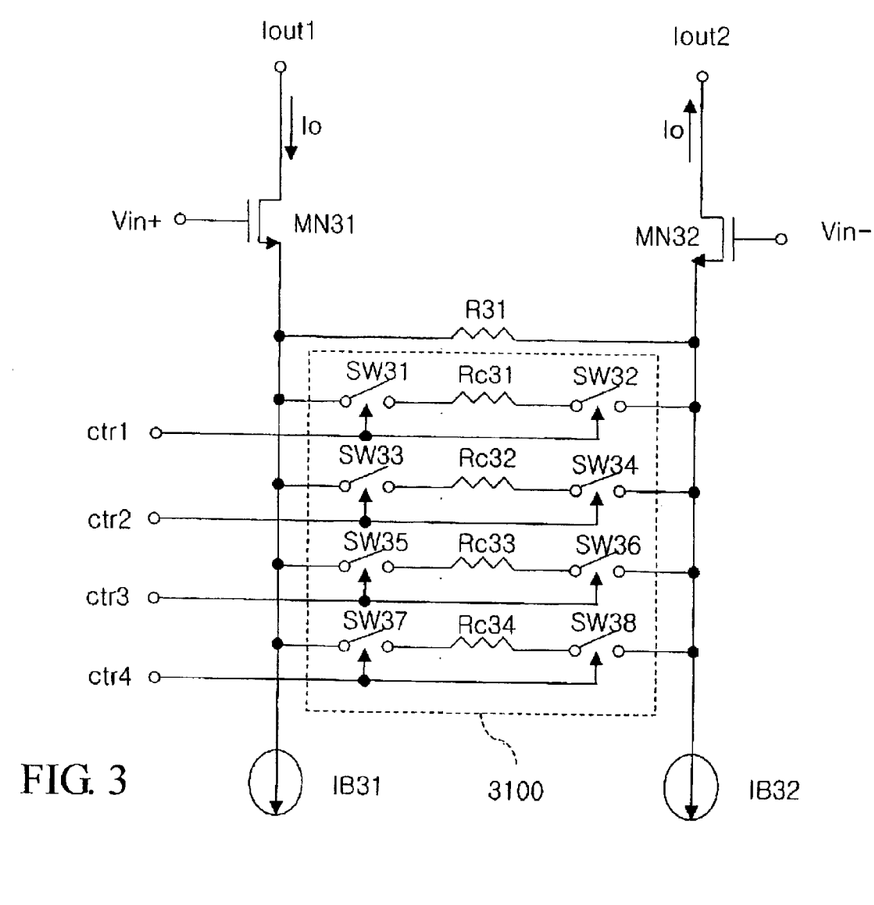
FIG. 3 shows a circuit diagram for describing control method of a transconductor varying circuit according to an embodiment of the present invention.

FIG. 3 shows a circuit diagram for the purpose of describing control method of transconductance varying circuit 3100 of an embodiment of the present invention.

Transconductance varying circuit 3100 shown in FIG. 3 comprises four resistors Rc31 to Rc34 and eight switching means SW31 to Sw39.

Switching means are connected to both ends of each resistor and are connected between the sources of first and second NMOS transistors MN31 and MN32. The same control signal is applied to the switching means connected to both ends of the same resistor. That is, the switching means connected to both ends of first to fourth resistors Rc31 to Rc34 operates as a pair and is on and off simultaneously.

Four bit control signals are necessary in the event that transconductor varying circuit 3100 are constituted with four resistors Rc31 to Rc34 and eight switching means SW31 to SW38. On-off of each switching means SW31 to SW39 is determined in accordance with the level of applied control signals ctr1 to ctr4. In transconductor varying circuit 3100 of one embodiment of the present invention, each switching means SW31 to SW38 is closed when the applied signal is high level and while it is open when the applied signal is low level. For example, when applied control signal is 1001, first and second switching means SW31 and SW32 and seventh and eighth switching means are closed, thereby constituting degeneration resistor with parallel connection of resistor Rc, first resistor R31 and fourth resistor R34.

Therefore, transconductance gm can be selected from sixteen values if transconductance control circuit 3100 is embodied as shown in FIG. 3 and cut-off frequency of the transconductor-capacitor filter is determined with the selected gm.

The tuning circuit according to another embodiment of the present invention relates to a tuning circuit of filter comprising a transconductor outputting current proportional to input voltage and a varying capacitor that is connected between the output node and ground node of the transconductor. The capacitance varies depending upon the level of control signal. The tuning circuit comprises a transconductor outputting current proportional to applied input voltage; a comparator that compares input voltage applied to the input node with the input voltage, and thereafter outputs signal to up-signal output node if the voltage of input node is higher and outputs signal to down-signal output node otherwise; a counter that is connected to the up-signal output node and down-signal output node, and reduces/rises the level of the output signal by a predetermined amount responding to up-signal and down-signal, with outputting control signal to the varying capacitor of the filter; a varying capacitor whose capacitance varies in accordance with the level of output signal of the counter, with being connected to the output node and the ground node of the transconductor; means for rendering the output voltage of the transconductor substantially zero for first period; means for inputting the input voltage to the transconductor of the tuning circuit for second period; and means for inputting the output voltage of the transconductor of the tuning circuit to the input node of the comparator for third period.

The transconductor of the tuning circuit may be embodied as being substantially same as the transconductor of the filter.

The varying capacitor of the tuning circuit may be embodied as being substantially same as the varying capacitor of the filter.

The tuning circuit further comprises a capacitor that is connected to the input node of the comparator and the ground node.

The varying capacitor may comprise a main capacitor, an auxiliary capacitor and switching means. One end of the main capacitor is connected with one end of the switching means so as to be connected with the output node of the transconductor while the other ends of the main capacitor and the auxiliary capacitor are grounded.

The varying capacitor may be embodied with one or more main capacitors and capacitor banks.

The Second Embodiment

Figure 4:
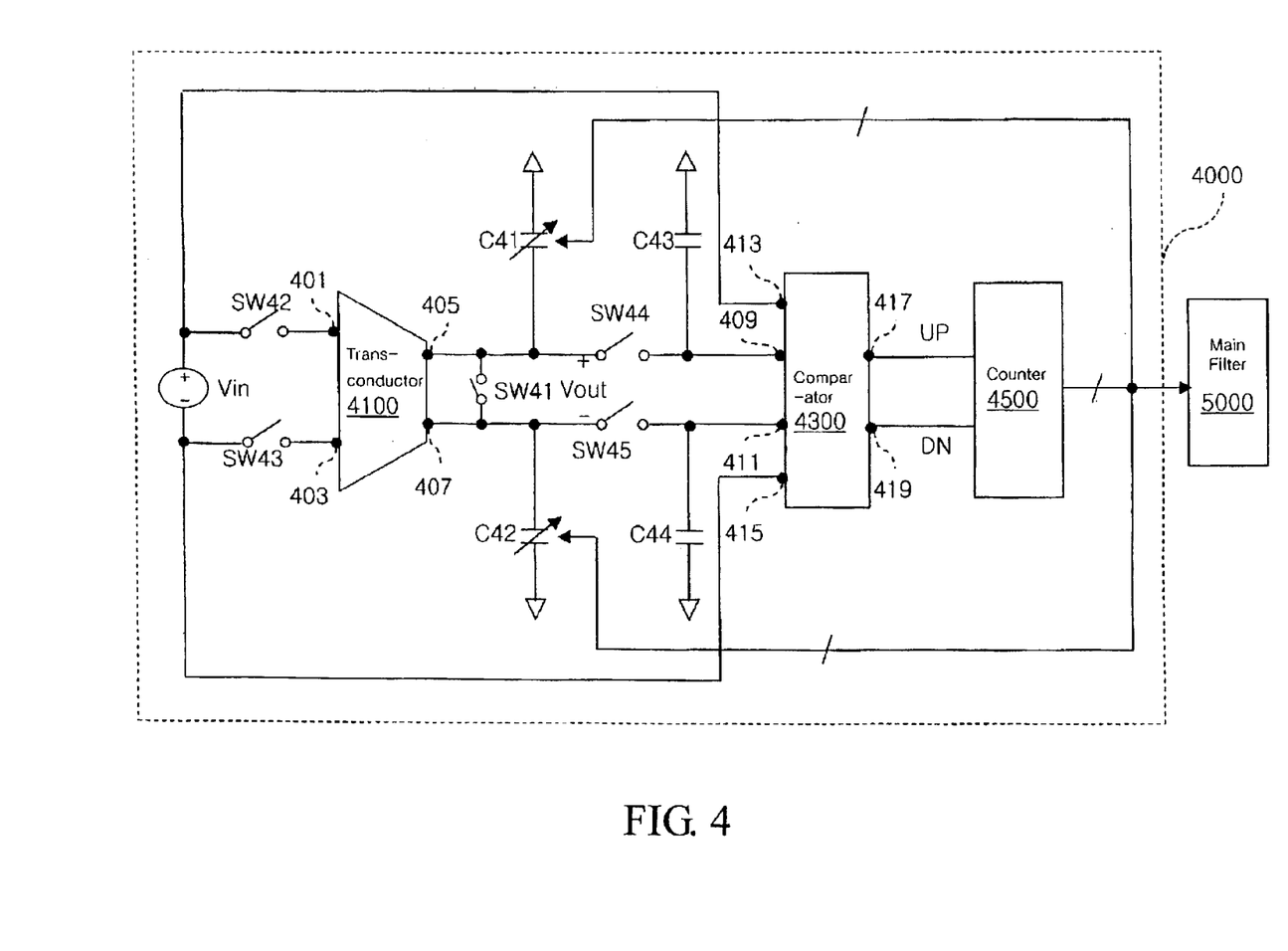
FIG. 4 shows a circuit diagram of tuning circuit of a transconductor-capacitor filter according to an embodiment of the present invention.

FIG. 4 shows a circuit diagram of a tuning circuit of transconductor-capacitor filter of another embodiment of the present invention.

Main filter 5000 shown in FIG. 4 is a transconductor-capacitor filter comprising a transconductor (not shown) and a varying capacitor (not shown). The transconductor of main filter 5000 outputs current proportional to input voltage applied to output node. As described in the above, transconductance gm varies depending upon process and environment variation. The varying capacitor of main filter 5000 is connected with the output node of the transconductor and its capacitance is controlled by control signal outputted from tuning circuit 4000. That is, capacitance is compensated by the variation amount of transconductance gm of transconductor, thereby maintaining the cut-off frequency as being constant.

Tuning circuit 4000 of further embodiment comprises a transconductor, a comparator, a counter, a varying capacitor and first to third switching means. The transconductor outputs current proportional to the applied input voltage. The comparator compares the input voltage with the output voltage of the transconductor applied to the input node. If the voltage of the input node is higher, the comparator outputs signal to up-signal output node. Otherwise, it outputs signal to down-signal output node. The counter is connected with the up-signal output node and the down-signal output node of the comparator. The counter increases or decreases the level of the output signal by a predetermined amount, responding to the up-signal and the down-signal. The output signal of the counter is inputted to the varying capacitor of the filter as control signal which controls capacitance of the varying capacitor. The varying capacitor of tuning circuit 4000 is connected with the output node of the transconductor. The capacitance is controlled by output signal of the counter, thereby controlling output voltage of transconductor. The first switching means sets output voltage of the transconductor to zero for first period. The second switching means inputs input voltage to the transconductor for second period. The third switching means inputs output voltage of the transconductor to input node of the comparator for third period.

Tuning circuit 4000 of the embodiment will be described in more detail with reference to FIG. 4.

As shown in FIG. 4, tuning circuit 4000 comprises a transconductor 4100, a comparator 4300, a counter 4500, first and second varying capacitors C41 and C42, third and fourth capacitors C43 and C44 and first to fifth switching means SW41 to SW45. Main filter 5000 comprises one or more transconductors and varying capacitors. Transconductor 4100 of tuning circuit 4000 and first and second varying capacitors C41 and C42 are embodied substantially same as the transconductor of main filter 5000 and varying capacitor.

Transconductor 4100 has first and second input nodes 401, 403 and first and second output nodes 405, 407 and controls current flows in first and second output nodes 405, 407 with accordance to the voltage applied in both of first and second input nodes 401, 403. That is, the output current of transconductor 4100 is proportional to the voltage applied to first and second input nodes 401, 403. The proportional coefficient is transconductance gm of transconductor 4100.

Comparator 4300 has first to fourth input nodes 409 to 415 and first and second output nodes 417, 419 and compares the voltage applied to first and second input nodes 409, 411 with the voltage applied to third and fourth input nodes 413, 415 so as to output up-signal UP and down-signal DN to first and second output nodes 417, 419. If the voltage applied to first and second input nodes 409, 411 is higher than the voltage applied to third and fourth input nodes 413, 415, up-signal UP of high level is outputted to first output node 417. Otherwise, down-signal DN of low level is outputted to second output node 419.

Counter 4500 outputs control signal that is generated by adding or reducing predetermined bits from the setting bits when comparator 4300 applies up-signal UP and down-signal DN. If up-signal UP is applied, the bit of the control signal increases while if down-signal DN is applied the bit of the control signal reduces by the predetermined bits.

In tuning circuit 4000 of another embodiment of the present invention, the substantially same control signal is applied to first and second varying capacitors C41 and C42 and the varying capacitors have the substantially same capacitance. Further, third and fourth capacitors C43 and C44 have the substantially same capacitance. That is, first and second varying capacitors C41 and C42 and third and fourth capacitors C43 and C44 operate as a pair, respectively.

First and second input nodes 401, 403 of transconductor 4100 are connected with + node and − node of input voltage Vin with second and third switching means SW42 and SW43, respectively. First and second output nodes 405, 407 are connected with first and second input nodes 409, 411 of comparator 4300 with fourth and fifth switching means SW44 an SW45, respectively.

Third and fourth input nodes 413, 415 of comparator 4300 are connected with + node and − node of input voltage Vin, respectively. Up-signal UP and down-signal DN are outputted from first and second output nodes 417, 419.

First and second varying capacitors C41 and C42 are connected with first and second output nodes 405, 407 of transconductor 4100 and ground node, respectively. Third and fourth capacitors C43 and C44 are connected with first and second input nodes 409, 411 of comparator 4300 and between grounds, respectively.

First switching means SW41 is connected between first and second output nodes 405, 407 of transconductor 4100.

Figure 5:
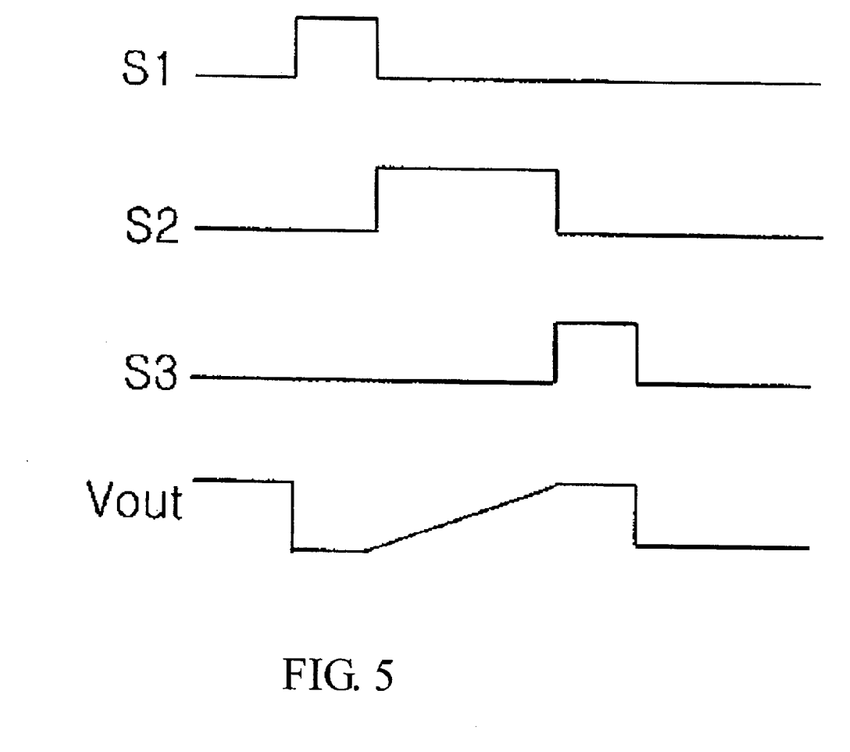
FIG. 5 shows a waveform of the voltage applied to first to fifth switching means SW51 to SW55 in the tuning circuit shown in FIG. 4 and a waveform of output voltage from the transconductor according to the applied voltage.

FIG. 5 shows a waveform of voltage s1, s2 and s3 applied to first to fifth switching means SW41 to SW45 and the output voltage Vout of transconductor 4100 therefrom.

In FIG. 2, s1 is a waveform of voltage applied to first switching means SW41; s2 is a waveform of voltage applied to second and third switching means SW42 and SW43; and s3 is a waveform of voltage applied to fourth and fifth switching means SW44 and SW45. Each switching means is in close state when the applied voltage is high level.

As shown in FIG. 5, s1, s2 and s3 maintain high level for the first period, the second period and the third period, respectively. s2 and s3 maintain low level while s1 maintains high level. Further, output voltage Vout of transconductor 4100 is substantially zero for the period. If s2 is high level, the output voltage Vout increases continuously until s2 becomes low level. That is, the second and third switching means SW42 and SW43 are closed for the second period. Further, current which has a value determined by multiplying input voltage Vin by transconductance gm, flows in the output node of transconductor 4100. Thus, the first and second varying capacitors C41 and C42 are charged and the output voltage Vout increases. If s3 becomes high level and if s1 and s2 become low level, the fourth and fifth switching means SW44 and SW45 are closed and the output voltage Vout maintains as being fixed voltage until s1 becomes high level.

The operation of tuning circuit 4000 of still further embodiment of the present invention will be described with reference to FIGS. 4 and 5.

In this embodiment, transconductor 4100 is embodied substantially same as the transconductor involved in main filter 5000, and reflects the variation of transconductance gm of the transconductor. That is, the variation of transconductance gm of the transconductor involved in main filter 5000 can be known by monitoring the variation of transconductance gm of transconductor 4100 involved in tuning circuit 4000.

Further, the cut-off frequency of main filter 5000 can be maintained as being constant, by applying the substantially same control signal as the control signal for compensating the variation of transconductance gm of transconductor 4100 involved in tuning circuit 4000.

The operation of tuning circuit 4000 of yet another embodiment of the present invention will be described in more detail.

When the fist switching means SW1 is closed, both of the first and second output nodes 405, 407 of transconductor 4100 are closed, thereby lowering the level of the output voltage Vout of transconductor 4100 to zero substantially. Further, the first and second varying capacitors C41 and C42 are discharged.

When the second and third switching means SW42 and SW43 are closed, input voltage Vin is applied to the first and second input nodes 401, 403 of transconductor 4100. Further, output current flows in first and second output nodes 405, 407. Thus, first and second varying capacitors C41 and C42 are charged during the time t when second and third switching means SW42 an SW43 are closed. Voltage Vout between first and second output nodes 405, 407 of transconductor 4100 is as follows.

$$Vout = \frac{1}{C}\int_0^t i\, dt = \frac{1}{C}\int_0^t ZVin \cdot gm\, dt = \frac{t}{C} \cdot gm \cdot Vin \qquad \text{Eqn. 1}$$

C means capacitance of first and second varying capacitors C141 and C42; i means current flowing in the output node of transconductor 4100; and gm means transconductance of transconductor 4100.

If voltage gain of transconductor 4100 is 1, transconductance gm of transconductor 4100 is C/t. The transconductance gm is not affected by process variation. That is, if input voltage Vin of transconductor 4100 is same as output voltage Vout, transconductance gm of transconductor 4100 is determined by capacitance C of first and second varying capacitors C41 and C42 and time t when second and third switching means SW42 and SW43 are closed, without being affected by process variation and operation environment.

Thus, if the period t of voltage that is applied to second and third switching means SW42 and SW43 in the above formula is set as C/gm, thereby making voltage gain of transconductor 4100 1, transconductance gm of transconductor 4100 cannot be affected by process variation and the like.

However, even if input voltage Vin is initially set so as to be same as output voltage Vout, output voltage Vout may have different from input voltage Vin in accordance with the variation of transconductance gm. Comparator 4300 compares input voltage Vin with output voltage Vout to detect the variation of transconductance.

In the above formula, output voltage Vout of transconductance 4100 is in inverse proportion to capacitance C of first and second varying capacitors C41 and C42. Thus, the variation of output voltage Vout caused by transconductance gm with controlling capacitance of first and second varying capacitors C41 and C42.

When fourth and fifth switching means SW44 and SW45 are closed, third and fourth capacitors C43 and C44 have common charge with first and second varying capacitors C41 and C42. Further, output voltage Vout of transconductor 4100 is applied to input nodes 409, 411 of comparator 4300. Comparator 4300 compares voltage Vout applied to first and second input nodes 409, 411 with input voltage Vin applied to third and fourth input nodes 413, 415 to output up-signal UP and down-signal DN toward first and second output nodes 417, 419. Specifically, if output voltage Vout of transconductor 4100 is higher than input voltage Vin, up-signal is outputted. Otherwise, down-signal is outputted.

Counter 4500 controls bits of control signal which is outputted in accordance with up-signal UP and down-signal DN from comparator 4300, and applies the control signal to first and second varying capacitors C41 and C42, thereby controlling capacitance C of first and second varying capacitors C41 and C42. The control signal is also applied to varying capacitor of main filter 5000 so that transconductance gm of the main filter is controlled with the same way as tuning circuit 4000.

FIG. 5 shows a circuit diagram of first and second varying capacitor of tuning circuit 4000 shown in FIG. 4.

Figure 6:
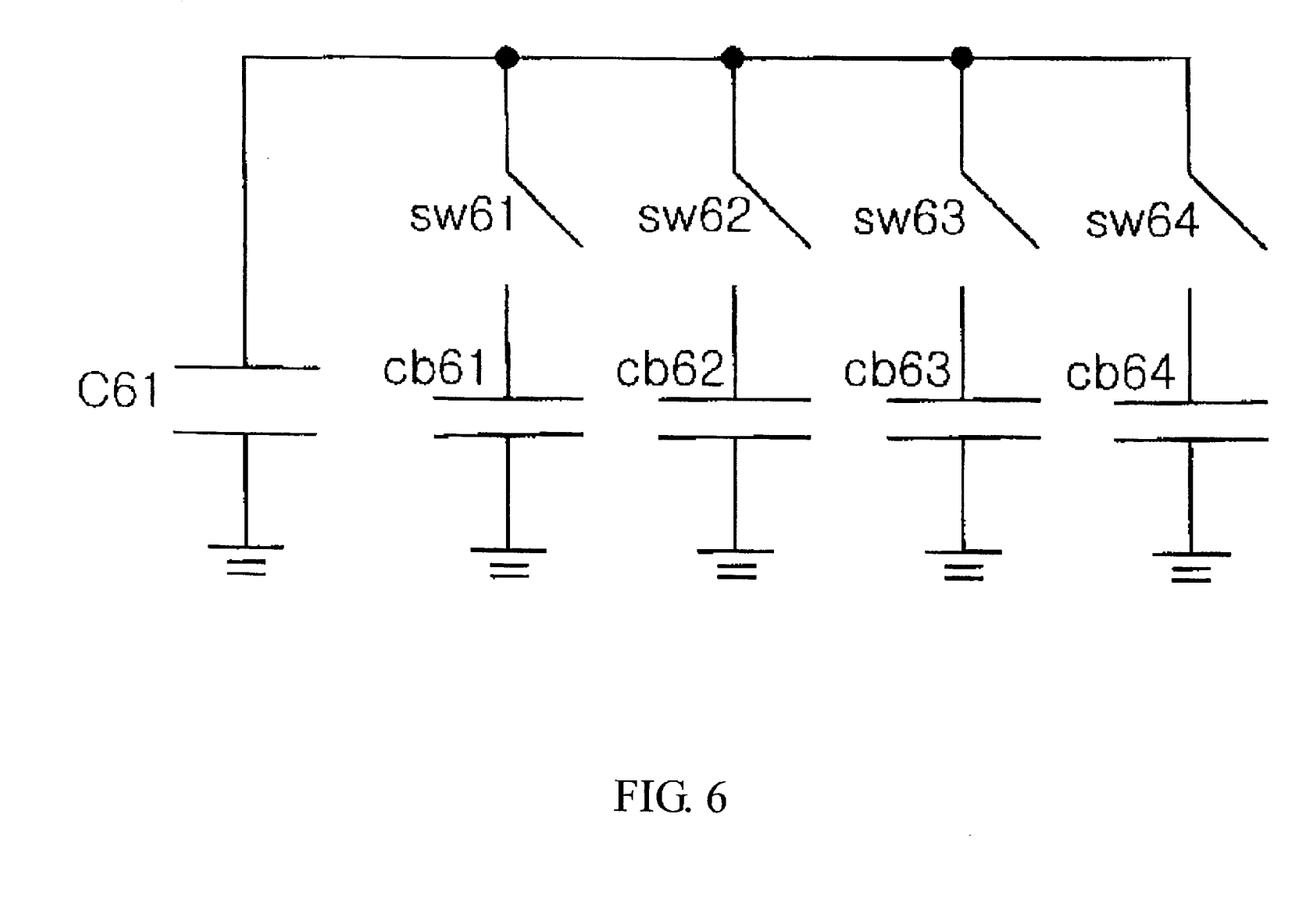
FIG. 6 shows a circuit diagram of the modified first and second varying capacitors according to another embodiment of the present invention, in the tuning circuit shown in FIG. 4.

As described in the above, first and second varying capacitors C41 and C42 have the substantially same capacitance due to the same control signal and are embodied with the same form. For convenience, only first varying capacitor C41 will be described.

As shown in FIG. 6, first varying capacitor C41 comprises one main capacitor C61, four auxiliary capacitors cb61 to cb64, and four switching means sw61 to sw64. One end of main capacitor C61 is connected with one end of first to fourth switching means sw61 to sw64 so as to be connected with first output node 405 of transconductor 4100 with the other end being grounded. The other end of first to fourth switching means sw61 to sw64 is connected with one end of first to fourth auxiliary capacitors cb61 to cb64. The other end of first and fourth auxiliary capacitors cb61 to cb64 is grounded. The auxiliary capacitors and switching means may be embodied with various forms. They can be embodied with capacitor bank that is widely used currently.

First varying capacitor shown in FIG. 6 comprises one main capacitor C61, four auxiliary capacitors cb61 to cb64 and four switching means sw61 to sw64. It is clear to a person skilled in the art that the number of the components can vary in accordance with embodiment. Further, the number of bits of the control signal from counter 4500 is determined by the number of the auxiliary capacitors serially connected one another and of switching means. That is, in the event that as shown in FIG. 6 four capacitors cb61 to cb64 and four switching means sw61 to sw64 are used, a counter that can output control signal with four or more bits is necessary. The control signal is outputted as binary form (0000~1111) between 0 and 15.

The control signal from counter 4500 is applied to first to fourth switching means sw41 to sw44. The switching means is on or off in accordance with the level of the control signal. In tuning circuit 4000, first to fourth switching means sw41 to sw44 are closed when the control signal that is applied to each switch is high level i.e., 1 while they are open otherwise. For example, if the control signal 1001, first and fourth switches sw41 to sw44 are closed while second and third switches sw42 and sw43 are open.

In tuning circuit 4000 of another embodiment of the present invention, standard control signal is applied to first and second capacitors C41 and C42 in initial state. The standard control signal determines initial capacitance Co of first and second varying capacitors C41 and C42. For example, if the standard control signal is set as 0110, the initial capacitance Co is determined with summation of main capacitor C61 and second and third auxiliary capacitor cb62 and cb63. Up-signal UP and down-signal DN increase and decrease bits of the standard control signal, respectively whenever it is applied, thereby controlling capacitance first and second varying capacitors C41 and C42.

Therefore, tuning circuit 4000 of one embodiment of the present invention compares input voltage Vin of transconductor 4100 with output voltage Vout to detect variation of transconductance gm, which can be compensated with control of capacitance of first and second varying capacitors C1 and C2. Further, the same signal as the control signal applied to tuning circuit 4000 is applied to compensate the variation of transconductance gm of main filter 4000.

As described in the above, first and second varying capacitors C41 and C42 can be embodied with one or more main capacitors, auxiliary capacitor and switching means. Their capacitance is controlled with control signal from counter 5000.

Further, tuning circuit 4000 of the present invention is a digital tuning circuit using counter 4500, which can be designed so as not to operate after a predetermined time necessary for tuning lapses. Further, the effect that tuning circuit makes to a main filter can be minimized contrary to the conventional analog tuning circuit, thereby saving electric power.

INDUSTRIAL APPLICABILITY

According to the transconductor circuit of the present invention, transconductance can be linearly varied with transconductance varying circuit using resistance switching.

Further, cut-off frequency of transconductor-capacitor filter can be varied within wide bandwidth, by varying transconductance of transconductor.

In a transconductor-capacitor filter, the variation of transconductance gm can be compensated with control of capacitance of capacitor and cut-off frequency of the filter can be maintained as being constant.

If tuning is unnecessary since a predetermined time passes after tuning, the tuning circuit can be made not operate, thereby reducing effect that tuning makes to main filter performance.

What is claimed is:

1. A transconductance varying circuit of a transconductor circuit comprising:
   a first and second amplifying devices having first, second and third nodes, the amount of current flowing to said second node from said first node being controlled in proportion to voltage applied to said third node;
   a resistor being connected between said second nodes of said first and second amplifying devices;
   a first and second bias current sources being connected with said second nodes and between grounds of said first and second amplifying devices; and
   at least one resistor and at least one switching means, wherein said resistor and switching means are serially connected with each other and being connected with said second nodes of said first and second amplifying device.

2. A transconductor-capacitor filter having a transconductor and capacitor, said transconductor comprising:
   a first and second amplifying devices having a first, second and third nodes, the amount of current flowing to said second node from said first node being controlled in proportion to voltage applied to said third node;
   a resistor being connected between said second nodes of said first and second amplifying devices;
   a first and second bias current source being connected with said second nodes and between grounds of said first and second amplifying devices; and
   at least one resistor and at least one switching means wherein said resistor and switching means are serially connected with each other to be connected with said second nodes of said first and second amplifying device.

3. The transconductor-capacitor filter of claim 2, wherein said first and second amplifying devices are MOSFET and wherein said first, second and third nodes are drain, source, and gate, respectively.

* * * * *